United States Patent
Jang et al.

(10) Patent No.: US 10,102,793 B2
(45) Date of Patent: Oct. 16, 2018

(54) BUILT-IN GATE DRIVER AND DISPLAY DEVICE USING THE SAME

(71) Applicant: LG Display Co., Ltd., Seoul (KR)

(72) Inventors: Yong-Ho Jang, Goyang-si (KR); Woo-Seok Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 221 days.

(21) Appl. No.: 15/186,107

(22) Filed: Jun. 17, 2016

(65) Prior Publication Data
US 2017/0004760 A1    Jan. 5, 2017

(30) Foreign Application Priority Data
Jun. 30, 2015    (KR) .................. 10-2015-0093543

(51) Int. Cl.
  *G09G 3/20* (2006.01)
  *G02F 1/1345* (2006.01)
  *G09G 3/3266* (2016.01)
  *G09G 3/36* (2006.01)
  *G11C 19/28* (2006.01)

(52) U.S. Cl.
  CPC ......... *G09G 3/2092* (2013.01); *G02F 1/1345* (2013.01); *G09G 3/3266* (2013.01); *G09G 3/3674* (2013.01); *G09G 3/3677* (2013.01); *G11C 19/28* (2013.01); *G09G 2300/0426* (2013.01); *G09G 2300/08* (2013.01); *G09G 2310/0286* (2013.01); *G09G 2310/08* (2013.01); *G09G 2320/0219* (2013.01); *G09G 2320/0223* (2013.01)

(58) Field of Classification Search
  CPC .. G02F 1/1345; G09G 3/3266; G09G 3/3674; G09G 3/3677
  USPC .......................................................... 345/204
  See application file for complete search history.

(56) References Cited

U.S. PATENT DOCUMENTS

| | | | |
|---|---|---|---|
| 2006/0061535 A1* | 3/2006 | Kim | G09G 3/3677 345/98 |
| 2011/0274236 A1* | 11/2011 | Tobita | G11C 19/28 377/79 |

(Continued)

FOREIGN PATENT DOCUMENTS

| | | |
|---|---|---|
| CN | 103700406 A | 4/2014 |
| CN | 104575350 A | 4/2015 |

(Continued)

*Primary Examiner* — Carolyn R Edwards
(74) *Attorney, Agent, or Firm* — Birch, Stewart, Kolasch & Birch, LLP

(57) ABSTRACT

Discussed are a built-in gate driver capable of improving output characteristics of the gate driver by reducing load of clock lines and a display device using the same. The built-in gate driver can include a shift register, a first clock group and a second clock group located in a non-display region of a display panel. The shift register includes a plurality of stages for individually driving gate lines of a display region. The first clock group includes clock lines arranged at a first side of the shift register. The second clock group includes clock lines arranged at a second side of the shift register. Each of the clock lines includes a main line and a branch line branched from the main line and connected to a corresponding stage. A branch line belonging to a corresponding clock group of any one of the first and second clock groups does not overlap a main line belonging to the other clock group.

18 Claims, 10 Drawing Sheets

(56) References Cited

U.S. PATENT DOCUMENTS

2013/0135284 A1* 5/2013 Tseng .................... G11C 19/28
                                                    345/212
2013/0293529 A1   11/2013  You et al.
2014/0044228 A1    2/2014  Jang
2015/0116008 A1    4/2015  Jang et al.

FOREIGN PATENT DOCUMENTS

EP         2541533 A1    1/2013
KR   10-2007-0080719 A   8/2007

* cited by examiner

BUILT-IN GATE DRIVER AND DISPLAY DEVICE USING THE SAME

CROSS REFERENCE TO THE RELATED APPLICATIONS

This application claims the benefit of Korean Patent Application No. 10-2015-0093543, filed on Jun. 30, 2015, which is hereby incorporated by reference as if fully set forth herein.

BACKGROUND OF THE INVENTION

Field of the Invention

The embodiments of the invention relate to a built-in gate driver and, more particularly, to a built-in gate driver capable of improving output characteristics of the gate driver by reducing load of clock lines and a display device using the same.

Discussion of the Related Art

Flat panel display devices include Liquid Crystal Displays (LCDs) using liquid crystal, Organic Light Emitting Diode (OLED) displays using OLEDs, and Electrophoretic Displays (EPDs) using electrophoretic particles. In more detail, a flat panel display device includes a display panel for displaying an image through a pixel array in which each pixel is independently driven by a Thin Film Transistor (TFT), a panel driver for driving the display panel, and a timing controller for controlling the panel driver. The panel driver includes a gate driver for driving gate lines of the display panel and a data driver for driving data lines of the display panel. Recently, the gate driver has mainly used a Gate-In-Panel (GIP) type which is formed together with a TFT array of a pixel array and is built in the display panel.

FIG. 1 is a diagram schematically illustrating a configuration of a related art built-in gate driver. Referring to FIG. 1, the built-in gate driver includes a shift register located in a non-display region of a display panel. The shift register includes stages ST1 to STn dependently connected to each other to individually drive gate lines G1 to Gn of the display panel and each stage includes a plurality of TFTs. The shift register also includes clock lines CLs for supplying clocks and power lines PLs for supplying power voltages. As shown, clock lines CLs and the power lines PLs are arranged in parallel at the outer side of the shift register in the proximity of the stages ST1 to STn.

However, the stages ST1 to STn have a problem with an increase in output delay in the direction of the bottom from the top thereof. The output delay of each stage is affected by a clock delay generated while a clock reaches an output TFT of a corresponding stage and the clock delay is affected by resistance and parasitic capacitance of a clock line.

In particular, the parasitic capacitance of a clock line includes parasitic capacitance of an output TFT connected to the clock line and an overlap capacitance caused by overlap between the clock line or another clock line and a power line. Generally, a polycrystalline silicon TFT or an oxide TFT using a coplanar structure has a relatively small parasitic capacitance of an output TFT, because the source and drain electrodes do not overlap the gate electrode. Therefore, the overlap capacitance caused by the overlap between the clock line and other lines has a relatively great effect on the clock delay.

SUMMARY OF THE INVENTION

Accordingly, one aspect of the present invention is to address the above-noted and other problems with the related art. In another aspect, the present invention is directed to a built-in gate driver for improving output characteristics of the gate driver by reducing the load of a clock line and a display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a built-in gate driver includes a shift register located in a non-display region of a display panel, the shift register including a plurality of stages for individually driving gate lines of a display region, a first clock group including clock lines arranged at a first side of the shift register, and a second clock group including clock lines arranged at a second side of the shift register, wherein each of the clock lines includes a main line and a branch line branched from the main line and connected to a corresponding stage, and a branch line belonging to a corresponding clock group of any one of the first and second clock groups does not overlap a main line belonging to the other clock group.

Each of the stages may include a first output unit and a second output unit for generating outputs using different clocks. The first output unit may include a first pull-up transistor receiving any one of clocks A supplied through the first clock group and generating a first output. The second output unit may include a second pull-up transistor receiving any one of clocks B supplied through the second clock group and generating a second output.

Any one of the first and second outputs may be a scan output supplied to a corresponding gate line and the other may be a carry output supplied to another stage as a carry signal, or the first and second outputs may be first and second scan outputs supplied to two gate lines and any one of the first and second scan outputs may be supplied to another stage as a carry signal.

The first and second pull-up transistors may be controlled by one control node. Alternatively, the first pull-up transistor may be controlled by a first control node and the second pull-up transistor may be controlled by a second control node. Each stage may further include a switching transistor for connecting or separating the first and second control nodes to or from each other.

When any one of the clocks A generated from the first clock group is used as the scan output and any one of the clocks B generated from the second clock group is used as the carry output, the first clock group may be arranged at one of an outer side of the shift register and an inner side between the shift register and the display region and the second group may be arranged at the other of the outer side and the inner side.

When any one of the clocks A generated from the first clock group is used as a scan output of a first gate line connected to a first switching transistor for switching a data signal in one subpixel and any one of the clocks B generated from the second clock group is used as a scan output of a second gate line connected to a second switching transistor for switching another signal in the subpixel, the first clock group may be arranged at one of an outer side of the shift register and an inner side between the shift register and the display region, and the second clock group may be arranged at the other of the outer side and the inner side.

A clock group having a greater number of clock lines among the first and second clock groups may be arranged at any one of an outer side of the shift register and an inner side between the shift register and the display region and the other clock group may be arranged at the other of the outer side and the inner side.

Each of the stages further may include a third output unit receiving any one of clocks C and generating a third output, and any one of the first and second clock groups may further include clock lines for supplying the clocks C.

Alternatively, each of the stages may further include a third output unit receiving either the clocks A or the clocks B and generating a third output.

To achieve these objects and other advantages and in accordance with the purpose of the invention, as embodied and broadly described herein, a display device includes a display panel including a display region and a non-display region, and a built-in gate driver located in the non-display region of the display panel. The built-in gate driver includes a shift register including a plurality of stages for individually driving gate lines of a display region, a first clock group including clock lines arranged at a first side of the shift register, and a second clock group including clock lines arranged at a second side of the shift register, wherein each of the clock lines includes a main line and a branch line branched from the main line and connected to a corresponding stage, and a branch line belonging to a corresponding clock group of any one of the first and second clock groups does not overlap a main line belonging to the other clock group.

It is to be understood that both the foregoing general description and the following detailed description of the present invention are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
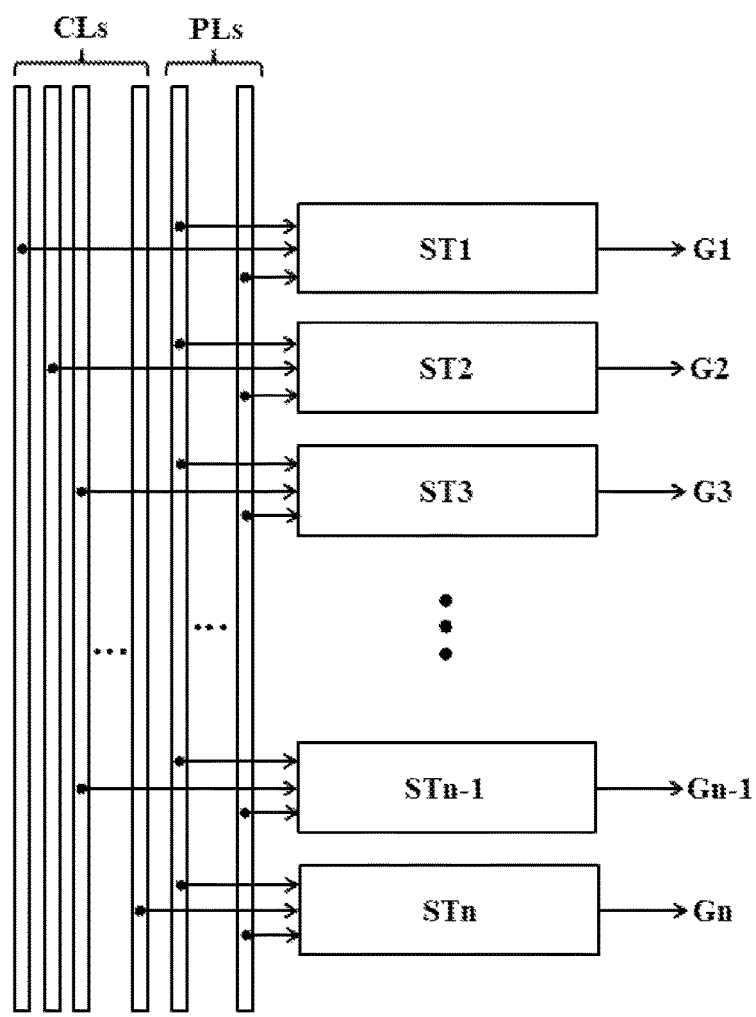
FIG. 1 is a diagram schematically illustrating a configuration of a related art built-in gate driver.
Figure 2:
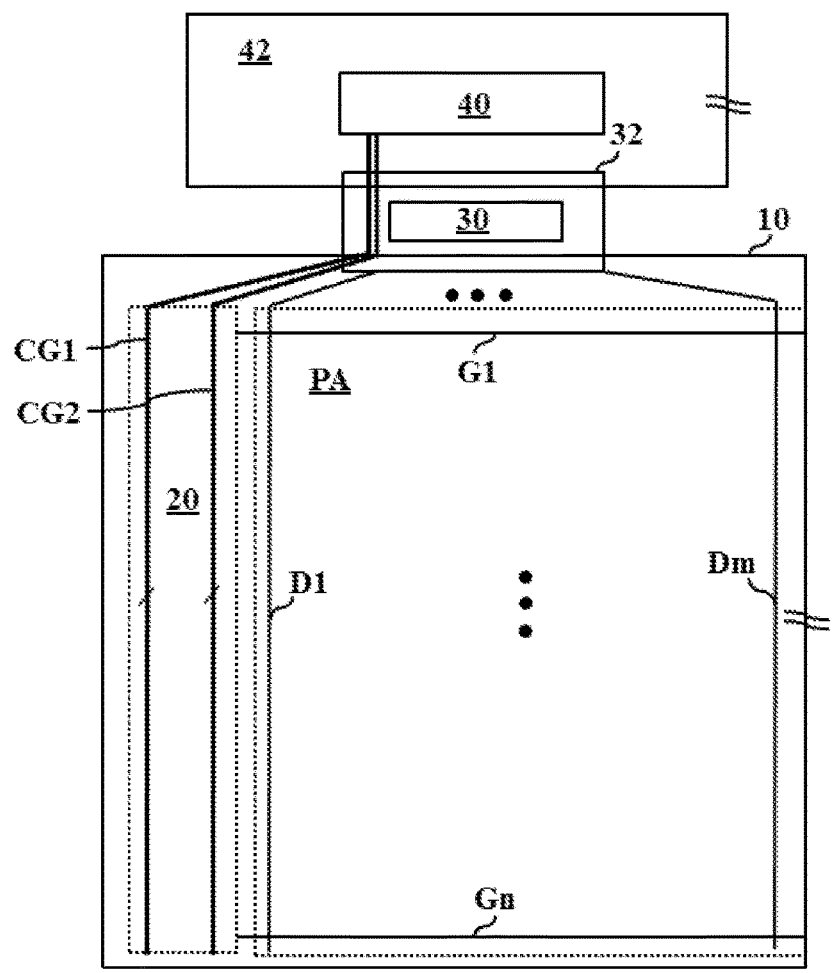
FIG. 2 is a diagram schematically illustrating a partial configuration of a display device according to an embodiment of the present invention.
Figure 3:
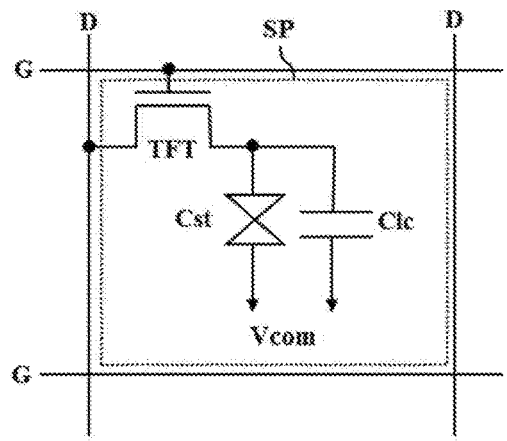
FIG. 3 is a circuit diagram illustrating an LCD subpixel applied to a display panel illustrated in FIG. 2.
Figure 4:
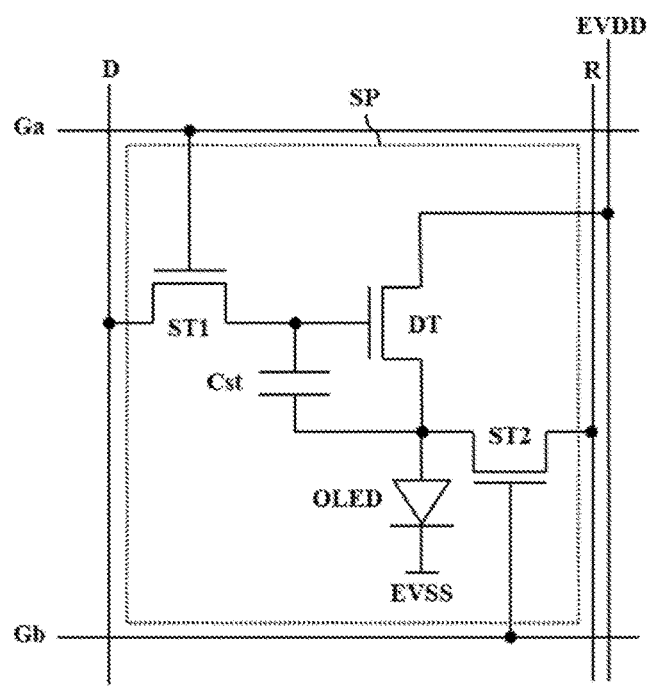
FIG. 4 is a circuit diagram illustrating an OLED subpixel applied to the display panel illustrated in FIG. 2.

FIG. 2 is a diagram schematically illustrating a partial configuration of a display device according to an embodiment of the present invention. In addition, FIGS. 3 4 are circuit diagrams illustrating an LCD subpixel and an OLED subpixel applied to a display panel illustrated in FIG. 2, respectively. As shown, the display device illustrated in FIG. 2 includes a display panel 10, which includes a pixel array PA and a gate driver 20, a data driver Integrated Circuit (IC) 30, and a timing controller IC 40.

The timing controller IC 40 mounted on a Printed Circuit Board (PCB) 42 receives synchronization signals together with image data supplied from a host set. In particular, the timing controller IC 40 corrects image data using various data processing methods for compensating for picture quality or reducing power consumption and outputs the corrected image data to the data driver IC 30.

The timing controller IC 40 generates data control signals for controlling an operation timing of the data driver 30 and gate control signals for controlling an operation timing of the gate driver 20, using the synchronization signals and supplies the data control signals and the gate control signals to corresponding drivers. The synchronization signals include a dot clock DCLK and a Data Enable (DE) signal and may further include a horizontal synchronization signal Hsync and a vertical synchronization signal Vsync. The data control signals include a Source Start Pulse (SSP) and a Source Shift Clock (SSC) for controlling a latch timing of image data in the data driver IC 30 and a Source Output Enable (SOE) signal for controlling an output duration of an image signal. The gate control signals include a start pulse Vst for controlling an operation timing of the gate driver 20 and clocks CLK used as an output signal or a shift control signal.

Further, the timing controller IC 40 supplies the image data and data control signals to the data driver IC 30 through the PCB 42 and through a Chip On Film (COF) 32 on which the data driver IC 30 is mounted. The gate control signals generated from the timing controller IC 40 are supplied to the gate driver 20 via the PCB 42, the COF 32 near the gate driver 20, and an outer region of the display panel 10. In this case, the gate control signals may further pass or may not pass through the data driver IC 30 on the corresponding COF 32.

Additionally, a level shifter may be additionally provided between the timing controller IC 40 and the gate driver 20. The level shifter may be installed in a power IC mounted on the PCB 42. The level shifter level-shifts Transistor-Transistor Logic (TTL) voltages of the gate control signals generated from the timing controller IC 40, i.e., the start pulse and the clocks, to a gate-on voltage (gate high voltage) and a gate-off voltage (gate low voltage) for driving TFTs of the display panel 10 and then supplies the level-shifted voltages to the gate driver 20. The power IC supplies a plurality of power voltages including the gate-on voltage and the gate-off voltage needed to drive the gate driver 20 to the gate driver 20 via the same path as the above-described gate control signals.

The data driver IC 30 mounted on each COF 32 supplies image data generated from the timing controller IC 40 to a plurality of data lines D of the display panel 10 in response to the data control signals generated from the timing controller IC 40. In particular, the data driver IC 30 converts the image data generated from the timing controller IC 40 into an analog data signal using a gamma voltage generated from a gamma voltage generator and supplies the data signal to the data lines D whenever each gate line G is driven. The data driver IC 30 may be mounted on the display panel 10 by a Chip On Glass (COG) scheme.

The display panel 10 displays an image through the pixel array PA of a matrix type. Each pixel of the pixel array PA produces a desired color through combination of red (R), green (G), blue (B) subpixels and may additionally include a white (W) subpixel for luminance enhancement. Each subpixel is independently driven by a Thin Film Transistor (TFT). The TFT may use an amorphous silicon (a-Si) TFT, polycrystalline silicon (poly-Si) TFT, an oxide TFT, or an organic TFT.

The display panel 10 may use an LCD, an OLED display, or an EPD. FIG. 3 is a circuit diagram illustrating an LCD subpixel applied to a display panel illustrated in FIG. 2. As shown, each subpixel SP of the LCD includes a TFT connected to a gate line G and a data line D and a liquid crystal capacitor Clc and a storage capacitor Cst connected in parallel between the TFT and a common electrode. The liquid crystal capacitor Clc charges a differential voltage between a data voltage supplied to a pixel electrode through the TFT and a common voltage Vcom supplied to the common electrode and drives liquid crystal according to the charged voltage, thereby controlling transmittance to be optimal. The storage capacitor Cst stably maintains the voltage charged in the liquid crystal capacitor Clc.

FIG. 4 is a circuit diagram schematically illustrating an OLED subpixel applied to the display panel illustrated in FIG. 2. As shown, each subpixel SP of the OLED display includes an OLED element and a pixel circuit as illustrated in FIG. 4. The OLED element connects between a high power voltage line EVDD and a low power voltage line EVSS. The pixel circuit includes first and second switching TFTs ST1 and ST2, a driving TFT DT, and a storage capacitor Cst, for independently driving the OLED element. The OLED element includes an anode connected to the driving TFT DT, a cathode connected to the low power voltage line EVSS, and a light emitting layer connected between the anode and the cathode, thereby generating light proportional to the amount of current supplied from the driving TFT DT.

The first switching TFT ST1 is driven by a gate signal of one gate line Ga to supply a data voltage from a corresponding data line D to a gate node of the driving TFT DT and the second switching TFT ST2 is driven by a gate signal of another gate line Gb to supply a reference voltage from a reference line R to a source node of the driving TFT DT. Additionally, the second switching TFT ST2 may be used as a path for supplying current from the driving TFT DT to the reference line R in a sensing mode.

The storage capacitor Cst connected between the gate node and source node of the driving TFT DT charges a differential voltage between a data voltage supplied to the gate node of the driving TFT DT through the first switching TFT ST1 and the reference voltage supplied to the source node of the driving TFT DT through the second switching TFT ST2 and supplies the charged voltage as a driving voltage of the driving TFT DT. The driving TFT DT supplies current proportional to the driving voltage to the OLED element by controlling current supplied from a high power voltage line EVDD according to the driving voltage supplied from the storage capacitor Cst, thereby driving the OLED element.

The gate driver 20 may be a GIP type built in a non-display region of the display panel 10 and may include TFTs formed on a substrate together with a TFT array of the pixel array PA. The built-in gate driver 20 may include a shift register SR and may drive gate lines G of the pixel array PA sequentially or by an interlacing scheme in response to the gate control signals generated from the timing controller IC 40. The gate driver 20 may supply a gate pulse of a gate-on voltage during a driving duration of each gate line G to enable a corresponding gate line G and supply a gate-off voltage during the other durations to disable the gate line G. The built-in gate driver 20 may be formed in an outer region of one side of the pixel array PA or in outer regions of both sides of the pixel array PA.

In particular, clock lines that supply a plurality of clocks generated from the timing controller IC 40 to the gate driver 20 may be divided into first and second clock groups CG1 and CG2 according to clock usage and the first and second clock groups CG1 and CG2 may be arranged at both sides of the gate driver 20. That is, the first clock group CG1 may be arranged at a first side which is one of an outer side of the gate driver 20 and an inner side between the gate driver 20 and the pixel array PA and the second clock group CG2 may be arranged at a second side which is the other side. As such, an overlap area between the first clock group CG1 and the second clock group CG2 is reduced and then load of each clock line is reduced, thereby decreasing clock delay and output delay.

Figure 5:
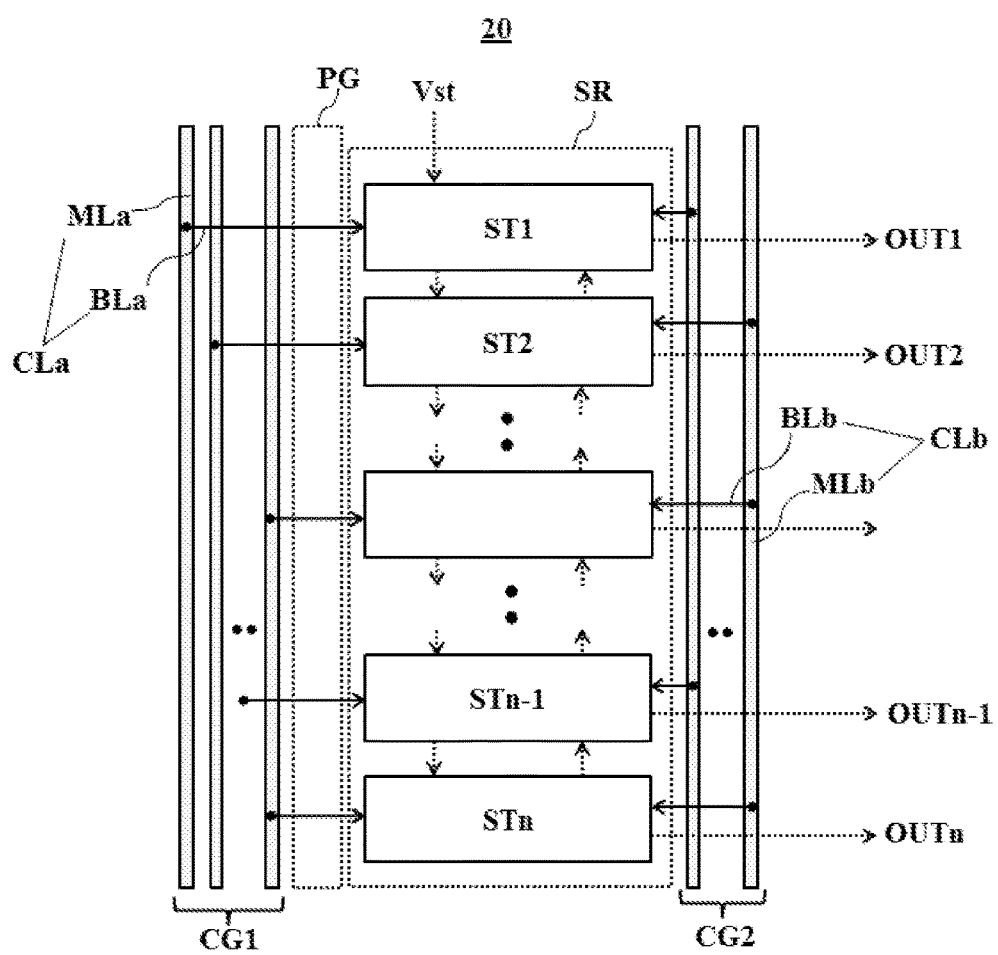
FIG. 5 is a diagram schematically illustrating a built-in gate driver according to a first embodiment of the present invention.

FIG. 5 is a diagram schematically illustrating a built-in gate driver according to a first embodiment of the present invention. A built-in gate driver 20 illustrated in FIG. 5 includes a shift register SR and first and second clock groups CG1 and CG2 arranged at both sides of the shift register SR. The built-in gate driver 20 further includes a power group PG including power lines arranged at one side of the shift register SR to supply power voltages to stages ST1 to STn.

The shift register SR includes the stages ST1 to STn for individually driving the gate lines G1 to Gn of the display panel 10 in FIG. 2. Hereinafter, a "front stage" indicates any one of one or more stages that have been driven to generate scan pulses prior to a corresponding stage and a "rear stage" indicates any one of one or more stages that will be driven to generate scan pulses after a corresponding stage.

The stages ST1 to STn are sequentially driven and each of the stages ST1 to STn supplies one clock to a corresponding gate line G as a scan output OUT and supplies another clock as a carry signal for controlling at least one of the rear stage and the front stage. The first stage ST1 receives a start pulse Vst instead of the carry signal from the front stage. The last stage STn may receive a reset pulse instead of the carry signal from the rear stage. At least one dummy stage that is not connected to a gate line and supplies corresponding output to another stage as the carry signal may be further provided after the last stage. If each stage ST uses different clocks for scan output and carry output, any one of the first clock group CG1 and the second clock group CG2 supplies a plurality of clocks A used for scan output and the other group supplies a plurality of clocks B used for carry output.

Each of the stages ST1 to STn generates, as the scan output OUT, any one clock A supplied to a first output unit thereof among i clocks A having sequentially delayed high pulse phases and generates, as the carry signal, any one clock B supplied to a second output unit thereof among j clocks B wherein i is different from or equal to j. For example, each of the stages ST1 to STn may sequentially generate any one of 4-phase clocks A as the scan output OUT and generate any one of 2-phase clocks B as the carry signal. However, the present invention is not limited thereto.

As shown in FIG. 5, the first clock group CG1 arranged at an outer side of the shift register SR supplies the clocks A used as the scan output and the second clock group CG2 arranged at an inner side between the shift register SR and the pixel array PA (of FIG. 2) supplies the clocks B used as the carry output. Alternatively, the first and second clock groups CG1 and CG2 may be arranged opposite to those shown in FIG. 5.

The first clock group CG1 includes i clock lines CLa that supply i clocks A, respectively, and each clock line of the first clock group CG1 includes a main line MLa that is longitudinally extended in an arrangement direction of the stages ST1 to STn at a first side of the shift register SR and a branch line BLa that is branched from the corresponding main line MLa and is connected to a corresponding stage ST. The main line MLa and the branch line BLa are located in different layers with an insulating layer disposed therebetween and are connected to each other through a contact hole or a contact electrode passing through the insulating layer. The branch line BLa may or may not overlap another main line MLa belonging to the first clock group CG1, with an insulating layer disposed therebetween.

The second clock group CG2 includes j clock lines CLb that supply j clocks B, respectively, and each clock line of the second clock group CG2 includes a main line MLb that is longitudinally extended in an arrangement direction of the stages ST1 to STn at a second side of the shift register SR and a branch line BLb that is branched from the corresponding main line MLb and is connected to a corresponding stage ST. The main line MLb and the branch line BLb are located in different layers with an insulating layer disposed therebetween and are connected to each other through a contact hole or a contact electrode passing through the insulating layer. The branch line BLb may or may not overlap another main line MLb belonging to the second clock group CG2, with an insulating layer disposed therebetween.

The branch line BLa belonging to the first clock group CG1 does not overlap the main line MLb belonging to the second clock group CG2 and the branch line BLb belonging to the second clock group CG2 does not overlap the main line MLa belonging to the first clock group CG1. As such, an overlap area between the first clock group CG1 and the second clock group CG2 is reduced and the load of each clock line is reduced, thereby decreasing clock delay and output delay.

Figure 6:
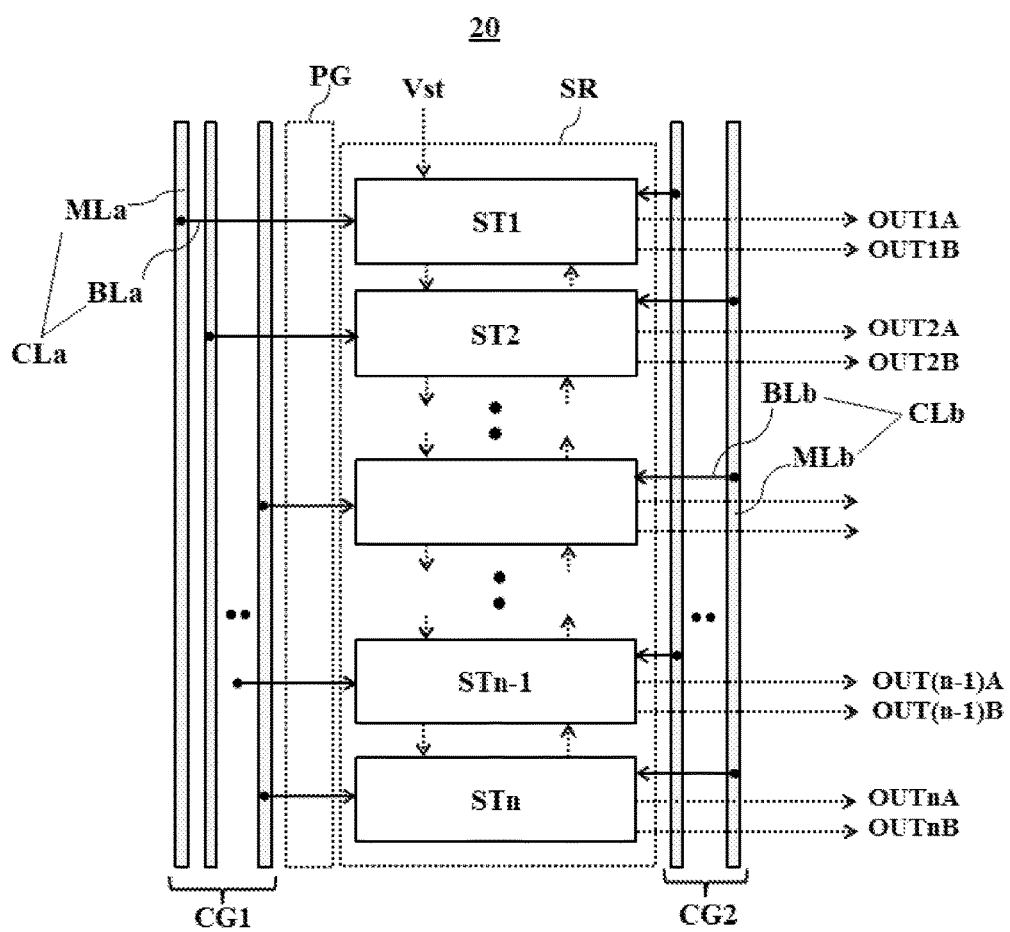
FIG. 6 is a diagram schematically illustrating a built-in gate driver according to a second embodiment of the present invention.

FIG. 6 is a diagram schematically illustrating a built-in gate driver according to a second embodiment of the present invention. A gate driver 20 of the second embodiment shown in FIG. 6 is different from that of the above-described first embodiment shown in FIG. 5 in that at least two scan outputs OUTkA and OUTkB (where k=1 to n) are generated from each stage. Accordingly, a description of identical elements in FIG. 5 and FIG. 6 will be omitted or will be given in brief.

In the second embodiment, each stage ST uses different clocks for the at least two scan outputs OUTkA and OUTkB, where one of the first clock group CG1 and the second clock group CG2 supplies a plurality of clocks A used as the A scan output OUTkA and the other group supplies a plurality of clocks B as the B scan output OUTkB. Each of the stages ST1 to STn generates any one clock A supplied to a first output unit thereof among the clocks A having sequentially delayed high pulse phases as the A scan output OUTkA and generates any one clock B supplied to a second output unit thereof among the clocks B as the B scan output OUTkB. For example, the A scan output OUTkA may be supplied to the gate line Ga for controlling the first switching TFT ST1 for switching a data signal in the OLED subpixel shown in FIG. 4 and the B scan output OUTkB may be supplied to the gate line Gb for controlling the second switching TFT ST2 for switching a reference signal or pixel current.

The first clock group CG1 that supplies the clocks A greatly affecting picture quality, i.e., the clocks A supplied to a gate line for controlling a data switching TFT as scan output, may be arranged at an outer side of a shift register SR. The second clock group CG2 that is used as carry output not supplied to the gate line or supplies clocks to a gate line for controlling another switching TFT may be arranged at an inner side between the gate driver 20 and a pixel array PA. Meanwhile, the number of clock lines arranged at the inner side between the shift register SR and the pixel array PA may be less than the number of clock lines of another clock group arranged at the outer side of the shift register SR.

Figure 7:
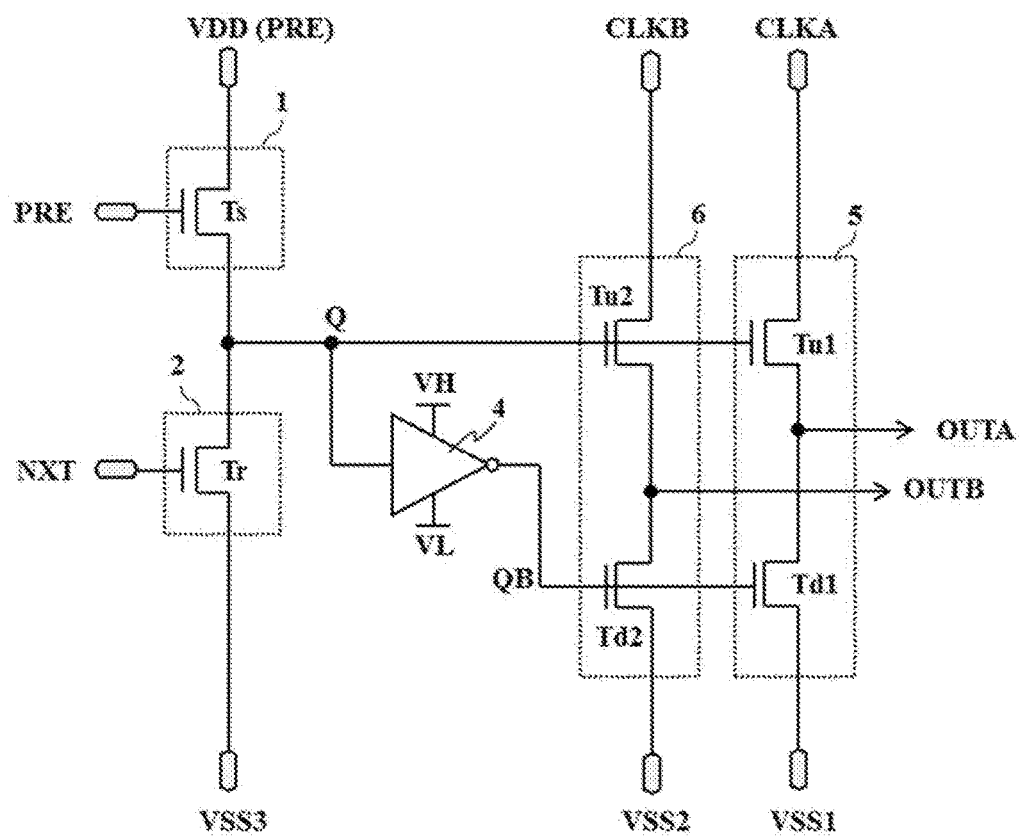
FIG. 7 is a circuit diagram illustrating a configuration of each stage applied to shift registers shown in FIGS. 5 and 6.

FIG. 7 is a circuit diagram illustrating a configuration of each stage applied to the shift registers shown in FIG. 5 and FIG. 6. Referring to FIG. 7, each stage includes a set unit 1, a reset unit 2, an inverter 4, a first output unit 5, and a second output unit 6. The set unit 1 and the reset unit 2 together are a Q node controller for controlling a first control node (hereinafter, a Q node) of the first and second output units 5 and 6. The inverter 4 may be a QB node controller for controlling a second control node (hereinafter, a QB node) of the first and second output units 5 and 6.

The set unit 1 includes a set transistor Ts for setting (charging) the Q node to a high power voltage VDD or a logic high signal of a front output PRE in response to the logic high signal of the front output PRE from a front stage. A start pulse Vst is supplied to the set unit 1 of a first stage ST1 instead of the front output PRE.

The reset unit 2 includes a reset transistor Tr for resetting the Q node to a low power voltage VSS3 in response to a rear output NXT from a rear stage. A reset pulse may be supplied to the reset unit 2 of a last stage STn instead of the rear output NXT. The inverter 4 supplies a logic voltage opposite to the Q node to the node QB using a high power voltage VH and a low power voltage VL.

The first output unit 5 outputs an A clock CLKA supplied from the above-described first clock group CG1 or a low power voltage VSS1 as an A output OUTA according to logic states of the Q node and the QB node. The output unit 5 includes a first pull-up transistor Tu1 for outputting the A clock CLKA as the A output OUTA in response to a logic high signal of the Q node and a first pull-down transistor Td1 for outputting the low power voltage VSS1 as the A output OUTA in response to a logic high signal of the QB node. The A output OUTA of the first output unit 5 is used as the scan output OUTi in FIG. 5 and the A scan output OUTiA in FIG. 6.

The second output unit 6 outputs a B clock CLKB supplied from the above-described second clock group CG2 or a low power voltage VSS2 as a B output OUTB according to the logic states of the Q node and the QB node. The output unit 6 includes a second pull-up transistor Tu2 for outputting the B clock CLKB as the B output OUTB in response to a logic high signal of the Q node and a first pull-down transistor Td2 for outputting the low power voltage VSS1 as the B output OUTB in response to a logic high signal of the QB node. The B output OUTB of the second output unit 6 is used as the carry output in FIG. 5 or the B scan output OUTiB in FIG. 6. The A output OUTA or the B output OUTB generated respectively from the first or second output unit 5 or 6 is supplied to the front stage or the rear stage as a carry signal.

In the operation of each stage, as the set transistor Ts of the set unit 1 sets the Q node to a logic high signal in response to the start pulse Vst or the front output PRE, the first pull-up transistor Tu1 of the first output unit 5 outputs the A clock CLKA as the A output OUTA and the second pull-up transistor Tu2 of the second output unit 6 outputs the B clock CLKB as the second output OUTB. Next, the reset transistor Tr of the reset unit 2 resets the Q node to the low power voltage VSS3 in response to the rear output NXT or a reset pulse. The first pull-down transistor Td1 of the first output unit 5 outputs the low power voltage VSS1 as the A output OUTA in response to the QB node of a logic high signal having an opposite signal to the Q node by the inverter 4 and maintains the A output OUTA. The second pull-down transistor Td2 of the second output unit 6 outputs the low power voltage VSS2 as the B output OUTB and maintains the B output OUTB. This operation of each stage is repeated in every frame.

The high power voltages VDD and VH supplied to each stage may be equal to or different from each other as voltage sources corresponding to a logic high signal and may be expressed as gate-on voltages. The low power voltages VSS1, VSS2, VSS3, and VL supplied to each stage may be equal to or different from each other as voltage sources corresponding to a logic low signal and may be expressed as gate-off voltages. The high power voltages VDD and VH and the low power voltages VSS1, VSS2, VSS3, and VL are supplied to each stage through power lines belonging to a power group PG.

Figure 8:
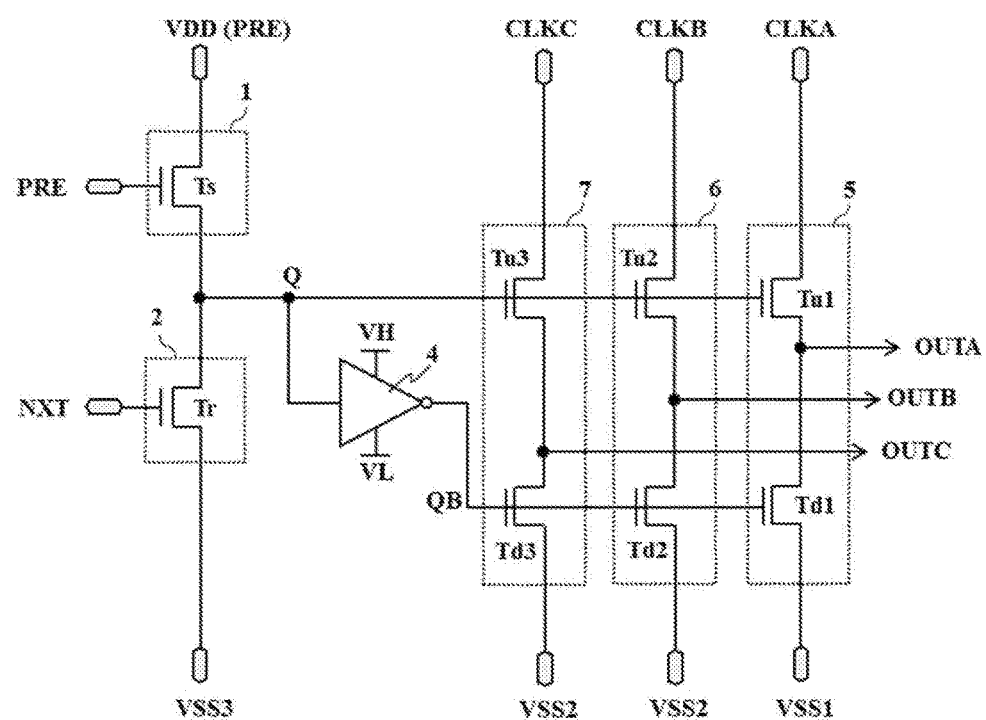
FIG. 8 is a circuit diagram illustrating another configuration of each stage applied to the shift registers shown in FIG. 6.
Figure 9:
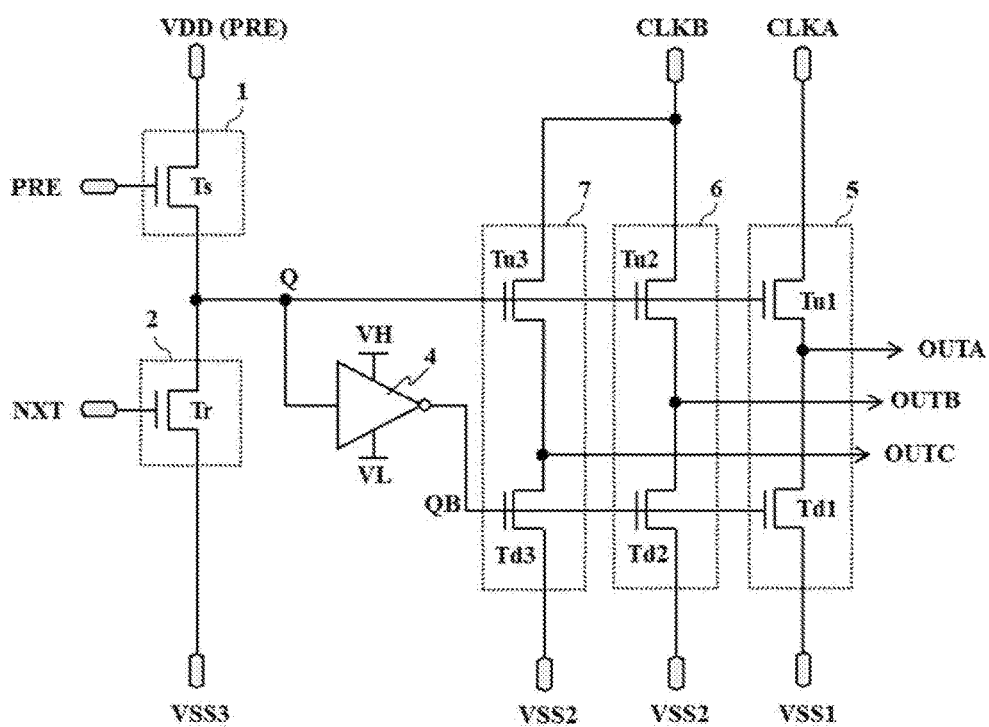
FIG. 9 is a circuit diagram illustrating still another configuration of each stage applied to the shift registers shown in FIG. 6.

FIG. 8 and FIG. 9 are circuit diagrams illustrating other configurations of each stage applied to the shift registers shown in FIG. 6. Stages shown in FIG. 8 and FIG. 9 are different from the stage shown in FIG. 7 in that a third output unit 7 that is controlled by a Q node and a QB node and generates a C output OUTC is additionally provided. Therefore, a description of elements identical to those of FIG. 7 will be omitted or will be given in brief.

The third output unit 7 shown in FIGS. 8 and 9 includes a third pull-up transistor Tu3 for outputting a C clock CLKC or a B clock CLKB as the C output OUTC in response to a logic high signal of the Q node and a third pull-down transistor Td3 for outputting a low power voltage VSS2 as the C output OUTC in response to a logic high signal of the QB node. The A, B, and C outputs OUTA, OUTB, and OUTC may be used as scan outputs supplied respectively to three gate lines and any one of the A, B, and C outputs OUTA, OUTB, and OUTC may be used as a carry signal. Alternatively, the A and B outputs OUTA and OUTB may be used as scan outputs supplied respectively to two gate lines and the C output OUTC may be used as a carry signal.

The C clock CLKC supplied to the third output unit 7 as illustrated in FIG. 8 may be supplied from any one of the first and second clock groups CG1 and CG2 shown in FIG. 6. In other words, any one of the first and second clock groups CG1 and CG2 shown in FIG. 6 may further include clock lines for supplying a plurality of clocks C. Meanwhile, the third pull-up transistor Tu3 of the third output unit 7 may share the B clock CLKB together with the pull-up transistor Tu2 of the second output unit 6.

Figure 10:
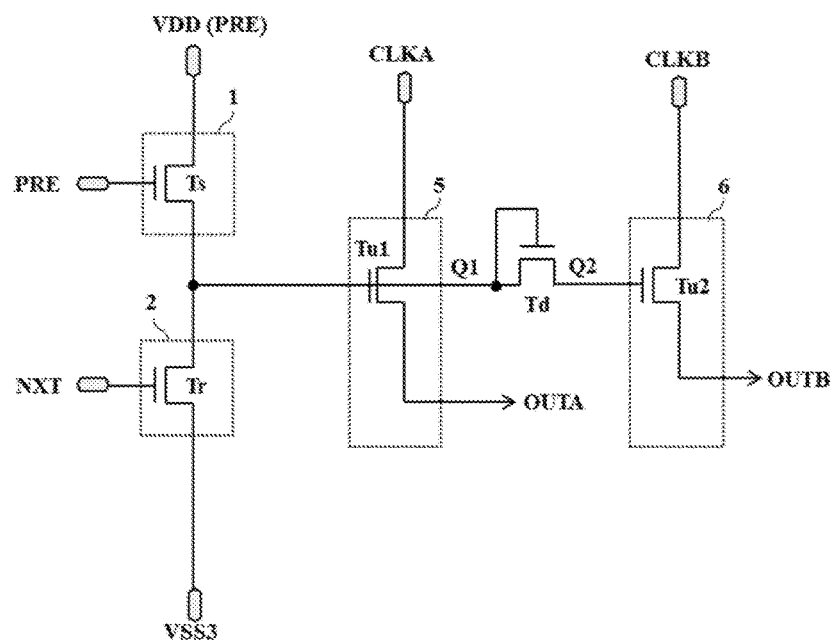
FIG. 10 is a circuit diagram illustrating another configuration of each stage applied to the shift register shown in FIG. 6.

FIG. 10 is a circuit diagram illustrating another configuration of each stage applied to the shift register shown in FIG. 6. A stage shown in FIG. 10 is different from the stage shown in FIG. 7 in that a Q1 node of a first output unit 5 and a Q2 node of a second output unit 6 are connected through a transistor Td. Therefore, a description of elements identical to those of FIG. 7 will be omitted or will be given in brief.

The transistor Td is connected as a diode structure between the Q1 node for controlling the first output unit 5 and the Q2 node for controlling the second output unit 6 and separates or connects the Q1 node and the Q2 node from, or to, each other according to a logic state of the Q1 node. If an A clock CLKA supplied from the first clock group CG1 (in FIG. 6) to the first output unit 5 and a B clock CLKB supplied from the second clock group CG2 (in FIG. 6) to the second output unit 6 have different pulse widths, an A output OUTA and a B output OUTB having different pulse widths may be output from one stage. The A and B outputs OUTA and OUTB may be used as scan outputs supplied respectively to two gate lines and any one of the A and B outputs OUTA and OUTB may be used as a carry signal.

Figure 11:
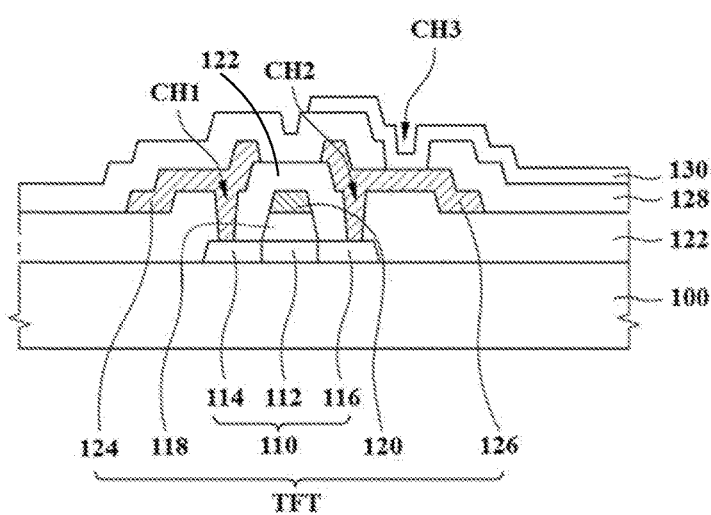
FIG. 11 is a cross-sectional view illustrating the structure of the LCD subpixel shown in FIG. 3.

FIG. 11 is a cross-sectional view illustrating the LCD subpixel shown in FIG. 3. Referring to FIG. 11, the subpixel includes a TFT including an active layer 110 formed on a substrate 100, a gate insulating layer 118 and a gate electrode 120 deposited on the active layer 110, an interlayer insulating layer 122 covering the gate insulating layer 118 and the gate electrode 120, and a source electrode 124 and a drain electrode 126 connected to a source region 114 and a drain region 116 through contact holes CH1 and CH2 passing through the interlayer insulating layer 122, respectively. A light-shielding layer and a buffer layer may further be formed between the substrate 100 and the active layer 110. The active layer 110 includes a channel region 112, and the source region 114 and the drain region 116 for ohmic contact with the source region 114 and the drain region 116, respectively. In addition, the subpixel further includes a passivation layer 128 covering the source electrode 124 and the drain electrode 126 on the interlayer insulating layer 122 and a pixel electrode 130 connected to the drain electrode 126 through a contact hole CH3 passing through the passivation layer 128.

Figure 12:
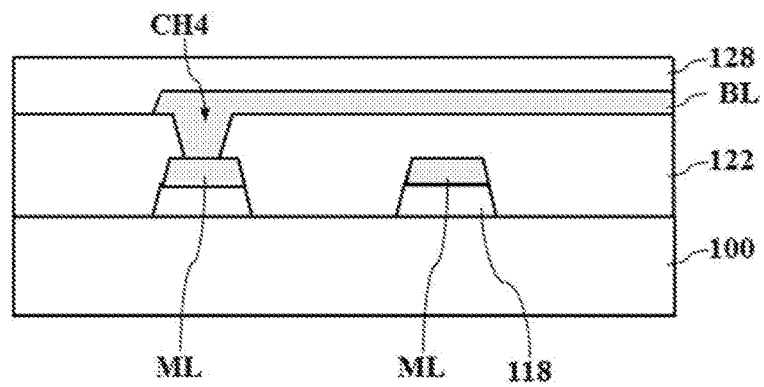
FIG. 12 and FIG. 13 are cross-sectional views of clock lines applied to the built-in gate driver of the present invention.
Figure 13:
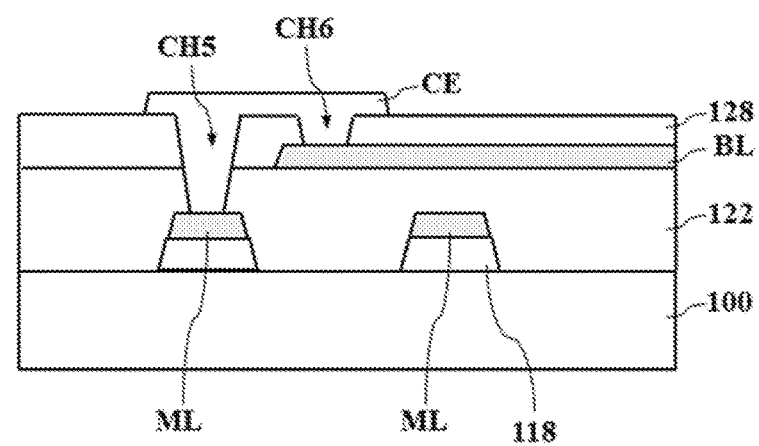

FIG. 12 and FIG. 13 are cross-sectional views of clock lines applied to the built-in gate driver of the present invention. Referring to FIGS. 12 and 13, a clock line includes a main line ML and a branch line BL formed with an interlayer insulating layer 122 disposed therebetween.

The main line ML of the clock line is formed on a gate insulating layer 118 on a substrate 100 and is formed with the same gate metal layer as the gate electrode 120 shown in FIG. 11. The branch line BL of the clock line is formed on the interlayer insulating layer 122 and is formed with the same source/drain metal layer as the source electrode 124 and the drain electrode 126 shown in FIG. 11.

As shown in FIG. 12, the branch line BL may be directly connected to the main line ML through a contact hole CH4 passing through the interlayer insulating layer 122. As shown in FIG. 13, the branch line BL may be connected to the main line ML through a connection electrode CE. The connection electrode CE is connected to the main line ML via a contact hole CH5 passing through the passivation layer 128 and the interlayer insulating layer 122 and to the branch line BL via a contact hole CH6 passing through the passivation layer 128. As a result, the main line ML and the branch line BL located in different layers are connected to each other. The connection electrode CE is formed of the same transparent metal layer as the pixel electrode 130 shown in FIG. 11. Meanwhile, locations of the main line ML and the branch line BL shown in FIG. 12 and FIG. 13 are interchangeable. In other words, the main line ML may be located on the interlayer insulating layer 122 and the branch line BL may be located on the gate insulating layer 118.

A branch line BL connected to any one main line ML belonging to a corresponding clock group overlaps another main line ML belonging to the clock group with the interlayer insulating layer 122 disposed therebetween but does not overlap other main lines belonging to another clock group. Therefore, overlap capacitance between clock lines, which produces a load on the clock lines, can be reduced.

In this way, the built-in gate driver according to the present invention can reduce overlap capacitance between clock lines, which produces a load on the clock lines, because clock lines of a corresponding clock group do not overlap clock lines of another clock group due to dividing clock lines into first and second clock groups CG1 and CG2 according to clock usage and separately arranging the clock groups CG1 and CG2 at both sides of a shift register SR.

For example, assuming that the number of clock lines A of the first clock group CG1 is Na, the number of clock lines B of the second clock group CG2 is Nb, the number of stages connected to corresponding clock lines is N, and overlap capacitances are the same, conventional load $C_{CLKA}$ of the clock line A and conventional load $C_{CLKB}$ of the clock line B may be determined by Equation 1.

$$C_{CLKA} = (Na-1) \times C1 \times \frac{N}{Na} + (Nb) \times C2 \times \frac{N}{Na}$$ [Equation 1]

$$C_{CLKB} = (Nb-1) \times C2 \times \frac{N}{Nb} + (Na) \times C1 \times \frac{N}{Nb}$$

In Equation 1, C1 is proportional to a size of line width of a main line MLa of the clock line A and C2 is proportional to a size of line width of a main line MLb of the clock line B. In Equation 1, the load $C_{CLKA}$ of the clock line A is calculated based on overlap of any one of the clock lines A with (Na−1) clock lines A and Nb clock lines B. The load $C_{CLKB}$ of the clock line B is calculated based on overlap of any one of the clock lines B with (Nb−1) clock lines B and Na clock lines A.

In the meantime, according to the present invention, any one of the clock lines A does not overlap Nb clock lines B and overlaps only (Na−1) clock lines A and any one of the clock lines B does not overlap Na clock lines A and overlaps only (Nb−1) clock lines B. Therefore, load $C_{CLKA}$ of the clock line A and load $C_{CLKB}$ of the clock line B according to the present invention may be determined by Equation 2. Reduced load $\Delta C_{CLKA}$ of the clock line A and reduced load $\Delta C_{CLKB}$ of the clock line B according to the present invention may be determined by Equation 3.

$$C_{CLKA} = (Na-1) \times C1 \times \frac{N}{Na}$$ [Equation 2]

$$C_{CLKB} = (Nb-1) \times C2 \times \frac{N}{Nb}$$

$$\Delta C_{CLKA} = (Nb) \times C2 \times \frac{N}{Na}$$ [Equation 3]

$$\Delta C_{CLKB} = (Na) \times C1 \times \frac{N}{Nb}$$

The built-in gate driver and the display device using the same according to the present invention can reduce overlap capacitance of each clock line compared with conventional overlap capacitance because clock lines of a corresponding clock group do not overlap clock lines of another clock group by grouping clock lines according to clock usage and separately arranging the clock groups at both sides of a shift register. Accordingly, the built-in gate driver and the display device using the same according to the present invention can reduce load of each clock line and thus reduce clock delay, thereby decreasing output delay of the gate driver compared with a conventional gate driver and improving output characteristics of the gate driver.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A built-in gate driver comprising:
a shift register located in a non-display region of a display panel, the shift register including a plurality of stages for individually driving gate lines of a display region;
a first clock group including clock lines arranged at a first side of the shift register; and
a second clock group including clock lines arranged at a second side of the shift register,
wherein each of the clock lines includes a main line and a branch line branched from the main line and connected to a corresponding stage, and
a branch line belonging to a corresponding clock group of any one of the first and second clock groups does not overlap a main line belonging to the other clock group, and
wherein a clock group having a greater number of clock lines among the first and second clock groups is arranged at any one of an outer side of the shift register and an inner side between the shift register and the display region, and the other clock group is arranged at the other of the outer side and the inner side.

2. The built-in gate driver according to claim 1, wherein each of the stages includes a first output unit and a second output unit for generating outputs using different clocks,
the first output unit includes a first pull-up transistor receiving any one of clocks A supplied through the first clock group and generating a first output, and
the second output unit includes a second pull-up transistor receiving any one of clocks B supplied through the second clock group and generating a second output.

3. The built-in gate driver according to claim 2,
wherein any one of the first and second outputs is a scan output supplied to a corresponding gate line and the other is a carry output supplied to another stage as a carry signal, or the first and second outputs are first and second scan outputs supplied to two gate lines and any one of the first and second scan outputs is supplied to another stage as a carry signal.

4. The built-in gate driver according to claim 3,
wherein the first and second pull-up transistors are controlled by one control node,
or
the first pull-up transistor is controlled by a first control node and the second pull-up transistor is controlled by a second control node, and each stage further includes a switching transistor for connecting or separating the first and second control nodes to or from each other.

5. The built-in gate driver according to claim 3,
wherein any one of the clocks A generated from the first clock group is used as the scan output and any one of the clocks B generated from the second clock group is used as the carry output,
the first clock group is arranged at one of an outer side of the shift register and an inner side between the shift register and the display region, and
the second clock group is arranged at the other of the outer side and the inner side.

6. The built-in gate driver according to claim 2,
wherein any one of the clocks A generated from the first clock group is used as a scan output of a first gate line connected to a first switching transistor for switching a data signal in one subpixel and any one of the clocks B generated from the second clock group is used as a scan output of a second gate line connected to a second switching transistor for switching another signal in the subpixel,
the first clock group is arranged at one of an outer side of the shift register and an inner side between the shift register and the display region, and
the second clock group is arranged at the other of the outer side and the inner side.

7. The built-in gate driver according to claim 2,
wherein each of the stages further includes a third output unit receiving any one of clocks C and generating a third output, and
any one of the first and second clock groups further includes clock lines for supplying the clocks C.

8. The built-in gate driver according to claim 2,
wherein each of the stages further includes a third output unit receiving either the clocks A or the clocks B and generating a third output.

9. The built-in gate driver according to claim 1,
wherein the branch line and the main line of each of the clock lines are located in different layers, in a manner that the branch line belonging to the corresponding clock group of any one of the first and second clock groups does not overlap in the different layers the main line belonging to the other clock group.

10. A display device comprising:
a display panel including a display region and a non-display region; and
a built-in gate driver located in the non-display region of the display panel,
wherein the built-in gate driver comprises:
  a shift register including a plurality of stages for individually driving gate lines of a display region;
  a first clock group including clock lines arranged at a first side of the shift register; and
  a second clock group including clock lines arranged at a second side of the shift register, wherein each of the clock lines includes a main line and a branch line branched from the main line and connected to a corresponding stage, and
a branch line belonging to a corresponding clock group of any one of the first and second clock groups does not overlap a main line belonging to the other clock group, and
wherein a clock group having a greater number of clock lines among the first and second clock groups is arranged at any one of an outer side of the shift register and an inner side between the shift register and the display region, and the other clock group is arranged at the other of the outer side and the inner side.

11. The display device according to claim 10,
wherein each of the stages includes a first output unit and a second output unit for generating outputs using different clocks,
the first output unit includes a first pull-up transistor receiving any one of clocks A supplied through the first clock group and generating a first output, and
the second output unit includes a second pull-up transistor receiving any one of clocks B supplied through the second clock group and generating a second output.

12. The display device according to claim 11,
wherein any one of the first and second outputs is a scan output supplied to a corresponding gate line and the other is a carry output supplied to another stage as a carry signal, or
the first and second outputs are first and second scan outputs supplied to two gate lines and any one of the first and second scan outputs is supplied to another stage as a carry signal.

13. The display device according to claim 12,
wherein the first and second pull-up transistors are controlled by one control node,
or
the first pull-up transistor is controlled by a first control node and the second pull-up transistor is controlled by a second control node, and each stage further includes a switching transistor for connecting or separating the first and second control nodes to or from each other.

14. The display device according to claim 12,
wherein any one of the clocks A generated from the first clock group is used as the scan output and any one of the clocks B generated from the second clock group is used as the carry output,
the first clock group is arranged at one of an outer side of the shift register and an inner side between the shift register and the display region, and
the second clock group is arranged at the other of the outer side and the inner side.

15. The display device according to claim 11,
wherein any one of the clocks A generated from the first clock group is used as a scan output of a first gate line connected to a first switching transistor for switching a data signal in one subpixel and any one of the clocks B generated from the second clock group is used as a scan output of a second gate line connected to a second switching transistor for switching another signal in the subpixel,
the first clock group is arranged at one of an outer side of the shift register and an inner side between the shift register and the display region, and
the second clock group is arranged at the other of the outer side and the inner side.

16. The display device according to claim 11,
wherein each of the stages further includes a third output unit receiving any one of clocks C and generating a third output, and
any one of the first and second clock groups further includes clock lines for supplying the clocks C.

17. The display device according to claim 11,
wherein each of the stages further includes a third output unit receiving either the clocks A or the clocks B and generating a third output.

18. The display device according to claim 10,
wherein the branch line and the main line of each of the clock lines are located in different layers, in a manner that the branch line belonging to the corresponding clock group of any one of the first and second clock groups does not overlap in the different layers the main line belonging to the other clock group.

* * * * *